(12) United States Patent
Bok et al.

(10) Patent No.: US 7,910,291 B2
(45) Date of Patent: Mar. 22, 2011

(54) METHOD FOR MANUFACTURING SEMICONDUCTOR DEVICE USING IMMERSION LITHOGRAPHY PROCESS

(75) Inventors: Cheol Kyu Bok, Seoul (KR); Hyun Sook Jun, Gyeonggi-do (KR); Tae Seung Eom, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 455 days.

(21) Appl. No.: 11/647,323

(22) Filed: Dec. 29, 2006

(65) Prior Publication Data
US 2007/0264593 A1   Nov. 15, 2007

(30) Foreign Application Priority Data

May 11, 2006   (KR) .................. 10-2006-0042482

(51) Int. Cl.
*G03F 7/26* (2006.01)
(52) U.S. Cl. ....................... 430/327; 430/330
(58) Field of Classification Search .............. 430/311
See application file for complete search history.

(56) References Cited

U.S. PATENT DOCUMENTS
2007/0048678 A1 * 3/2007 Chen et al. .................. 430/394

FOREIGN PATENT DOCUMENTS
KR   1020060002229 A   1/2006
* cited by examiner

*Primary Examiner* — Kathleen Duda
(74) *Attorney, Agent, or Firm* — Kilpatrick Townsend & Stockton LLP

(57) ABSTRACT

A method for manufacturing a semiconductor device using an immersion lithography process is disclosed. The immersion lithography process includes forming a photoresist film over an underlying layer of a semiconductor substrate; exposing the photoresist film to light without using an exposure mask; and performing an exposure process using an exposure mask. After exposure using the immersion lithography, a water mark generated from the exposure layer consumes a part of the acid of the exposure layer but the residual acid remains in the exposure layer to prevent generation of pattern defects such as T-top or pattern bridges.

8 Claims, 9 Drawing Sheets

METHOD FOR MANUFACTURING SEMICONDUCTOR DEVICE USING IMMERSION LITHOGRAPHY PROCESS

CROSS-REFERENCES TO RELATED APPLICATIONS

The present application claims priority to Korean patent application number 10-2006-0042482, filed on May 11, 2006, which is incorporated by reference in its entirety.

BACKGROUND OF THE INVENTION

The present invention relates to a method for manufacturing a semiconductor device using an immersion lithography process.

In order to manufacture semiconductor devices that have been smaller, patterns have also become smaller. In exposers, although KrF (248 nm) or ArF (193 nm) as an exposure light source have been applied to an exposure process, attempts have been made to use short wavelength light sources such as $F_2$ (157 nm) or EUV (13 nm) to increase numerical apertures (NA).

However, when new light sources such as $F_2$ are applied, a new exposer is required, which results in increasing manufacturing costs. Also, the increase of numerical apertures degrades a focus depth width.

Recently, an immersion lithography process has been developed in order to solve these problems. While an existing exposure process utilizes air having a refractive index of 1.0 as a medium of exposure beams between substrates having a photoresist film and an exposure lens of an exposer, the immersion lithography process utilizes a solution such as $H_2O$ or an organic solvent having a refractive index of more than 1.0 as a medium of exposure beams. As a result, although exposer light sources having the same wavelength are used, the same effect is obtained as when a light source of a shorter wavelength is used or a lens having high numerical apertures is used, without degradation of the depth of focus.

The immersion lithography process improves the depth of focus. Moreover, fine patterns of less than 60 nm can be formed with the existing exposure light sources.

BRIEF SUMMARY OF THE INVENTION

Embodiments of the present invention are directed at a method for manufacturing a semiconductor device using an immersion lithography process.

In one embodiment, a method for manufacturing a semiconductor device using an immersion lithography process comprises forming a photoresist film over an underlying layer of a semiconductor substrate; performing an exposure process on the photoresist film without using an exposure mask; and performing an immersion exposure process.

The method comprises: forming a photoresist film over an underlying layer of a semiconductor substrate; exposing the photoresist film without using an exposure mask; performing an immersion exposure process using an exposure mask; baking the resulting structure; and developing the resulting structure to form a photoresist pattern.

The exposure process without using an exposure mask is performed with an exposure energy ranging from about 1 to about 5 $mJ/cm^2$ during such time that the acid contained in the upper portion of the photoresist film is released. The thickness of the upper portion of the photoresist film ranges about 2 to about 3% of that of the photoresist film.

The method further comprises performing a pre-soak process on the photoresist film with deionized water in the mask-using-exposure-process.

The exposure process is performed using an exposure light selected from the group consisting of G-line (436 nm), i-line (365 nm), KrF (248 nm), ArF (193 nm), $F_2$ (157 nm) and EUV (13 nm).

In another embodiment, a method for manufacturing a semiconductor device using an immersion lithography process, characterized in that the method further comprises the step of exposing the photoresist film to light without using a mask, before performing an exposure process using a mask.

DESCRIPTION OF SPECIFIC EMBODIMENTS

The present invention will be described in detail with reference to the accompanying drawings.

FIGS. 1a through 1e are diagrams illustrating a method for manufacturing a semiconductor device using an immersion lithography process.

Figure 1A:
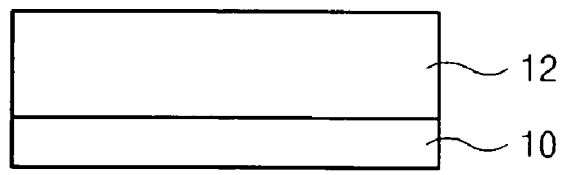
FIGS. 1a through 1e are diagrams illustrating a method for manufacturing a semiconductor device using an immersion lithography process.
Figure 1B:
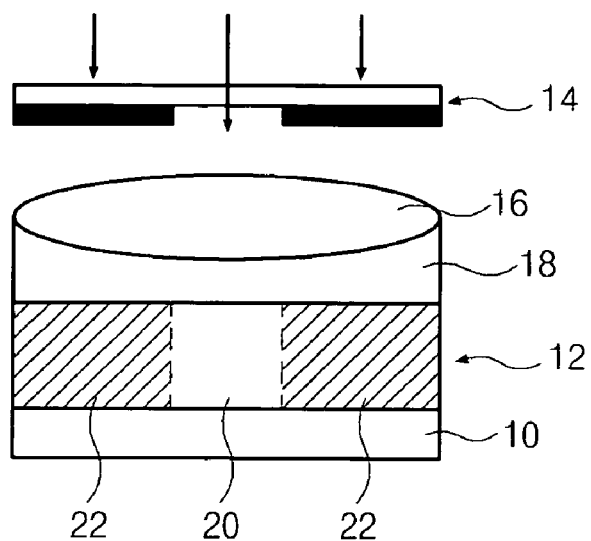

A photoresist film 12 is formed over an underlying layer (not shown) of a semiconductor substrate 10, and then soft-baked (Refer to FIG. 1a).

An exposure process is performed with an exposure mask 14 and an exposer for immersion lithography. $H_2O$ 18 is used as a medium of an exposure beam between the substrates 10 including an exposure lens 16 and the photoresist film 12 of the exposer. Ingredients such as a photoacid generator and a quencher are flown out from the photoresist film 12 and dissolved in the $H_2O$ 18, which contaminates the surface of the lens 16 to degrade uniformity of the pattern line-width (Refer to FIG. 1b).

Figure 1C:
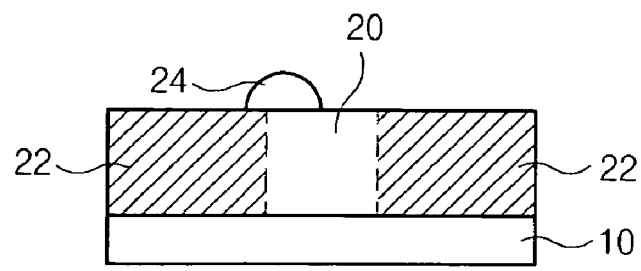
Figure 1D:
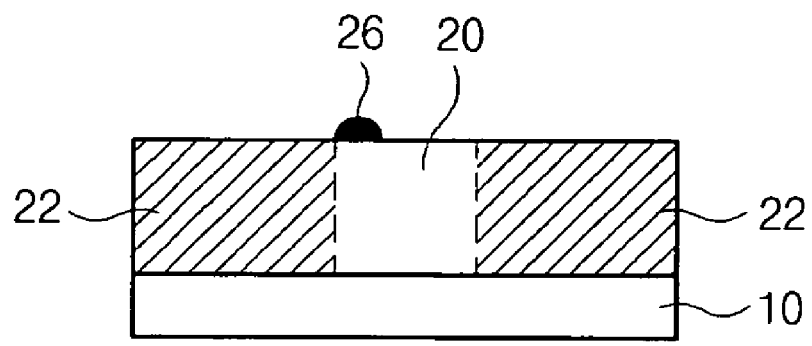
Figure 1E:
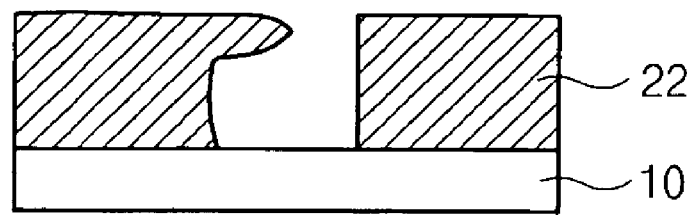

An exposed region 20 and an unexposed region 22 are formed in the photoresist film 12 as a result of the exposure process, and water drops 24 are generated over the photoresist film 12 (Refer to FIG. 1c).

The resulting structure is baked. As a result, after the water drops 24 are evaporated, water marks 26 remain. When the water marks 26 consume acid of the exposed region 20, detachment of a dissolving inhibitor of photoresist resin during the baking process is prevented. If the detachment reaction does not occur, the exposed region 20 is not dissolved in a developing solution (Refer to FIG. 1d).

The resulting structure is developed to form a desired pattern. As a result, the exposed region 20 of the lower water mark 26 which remains over the photoresist film 12 is not dissolved in the developing solution to generate defects where T-top shaped patterns are formed (Refer to FIG. 1e).

Figure 2:
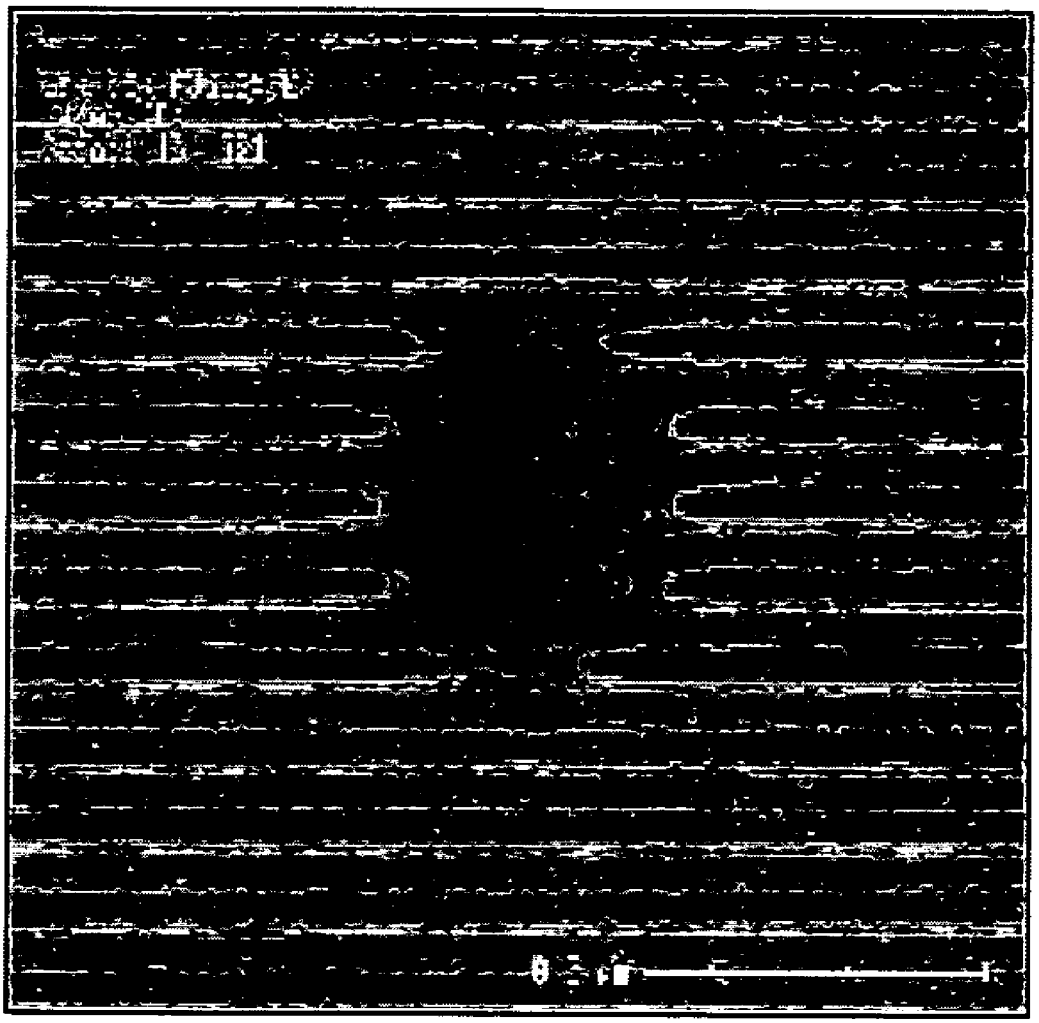
FIG. 2 is a SEM photograph illustrating a water mark defect generated in an immersion lithography process.

FIG. 2 is a SEM photograph illustrating a water mark defect generated in an immersion lithography process.

Figure 3A:
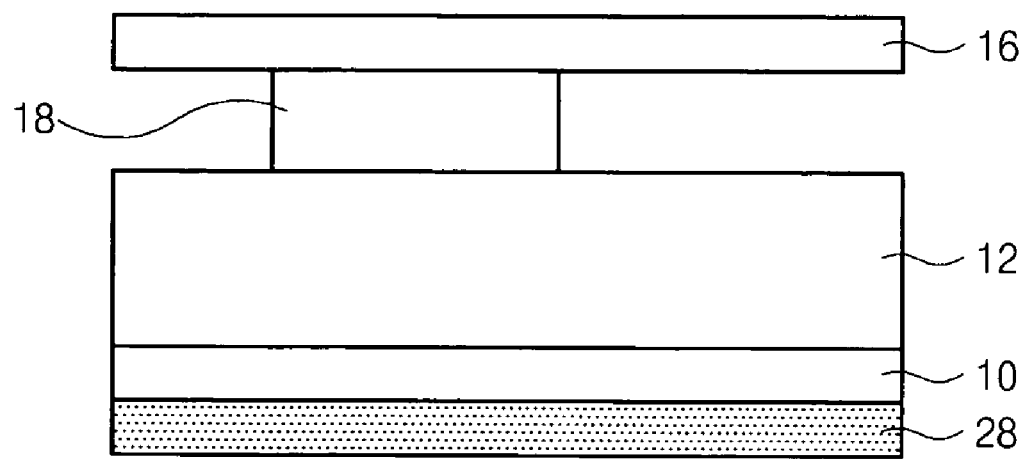
FIGS. 3a and 3b are diagrams illustrating a process of generating water drops in an immersion lithography process.
Figure 3B:
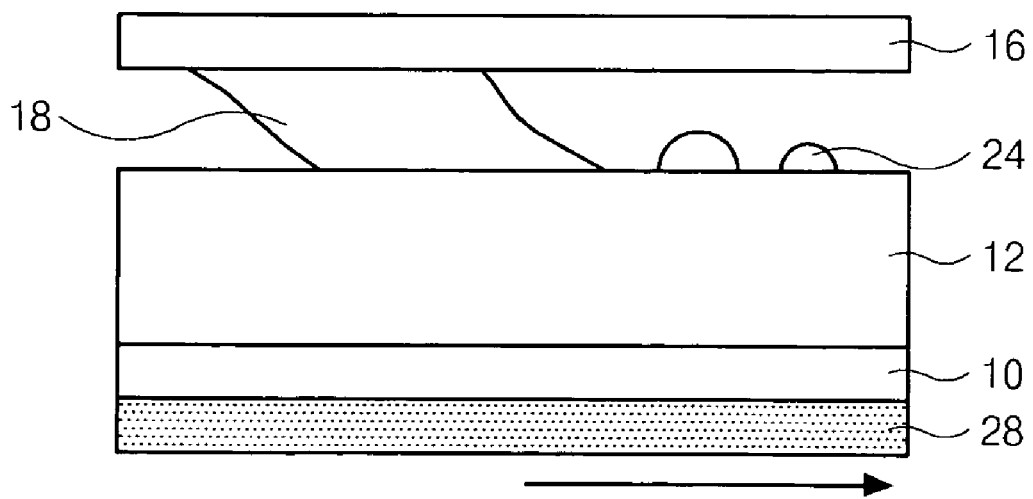

FIGS. 3a and 3b are diagrams illustrating a process of generating water drops in an immersion lithography process.

FIG. 3a shows when an exposure stage 28 is stopped in the exposure process using a scanner type exposure.

FIG. 3b shows when the exposure stage 28 is scanned and moved rightward.

The stopped stage 28 is scanned and the water drops 24 are generated. When the stage 28 moves rightward, a meniscus of the $H_2O$ 18 bends leftward and breaks to generate the water drops, which drop down the photoresist film 12.

The meniscus easily breaks as the scanning speed of the stage 28 becomes faster so that the water drops 24 are generated as much. However, since the scanning speed of the scanner is required to be faster to improve productivity although the water drops 24 increase in a semiconductor process, it is necessary to develop a method for removing defects by the water drops 24 in the immersion lithography process.

Figure 4:
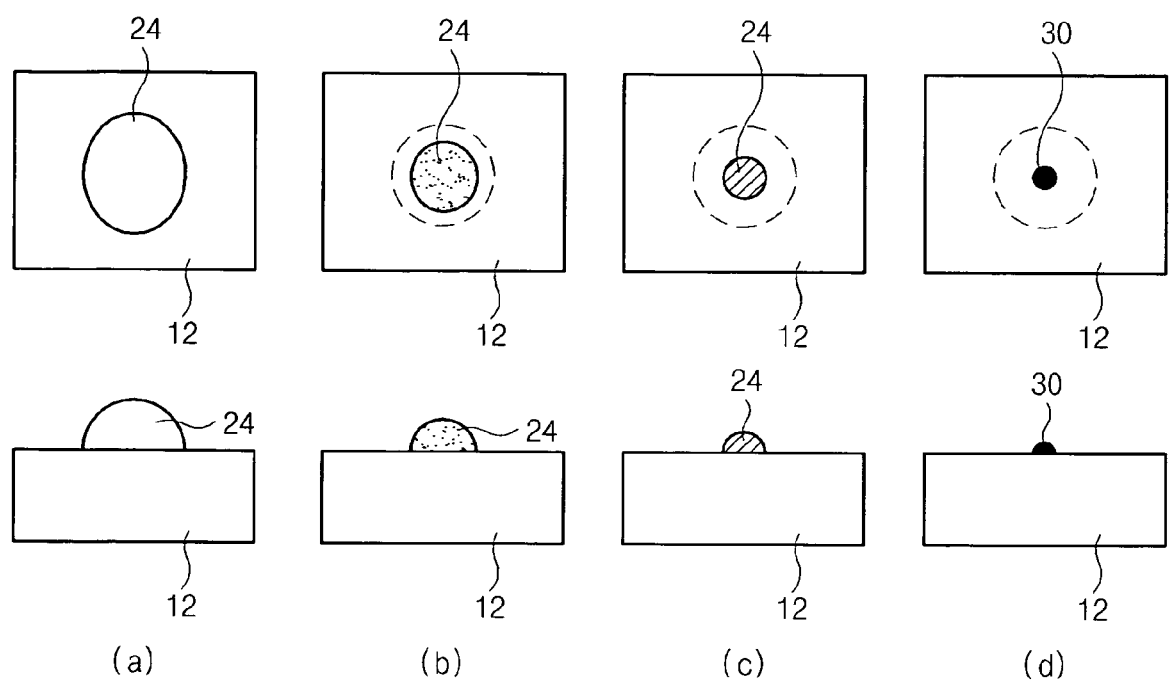
FIG. 4 is a diagram illustrating a defect generating mechanism by water drops in an immersion lithography process.

FIG. 4 is a diagram illustrating a defect generating mechanism by the water drops 24 over the photoresist film 12 which form the water marks 26 during the subsequent process. In FIG. 4, the top shows a plane view and the bottom shows a side view.

When water is evaporated, the water drop 24 becomes smaller. (a) of FIG. 4 shows that no foreign materials are included in the water drop 24 before a post baking. In (b) and (c) that show the state of the post baking process, the water drop 24 becomes smaller while the water drop 24 is evaporated, and a foreign material 30 from the photoresist film 12 is gradually melt in the water drop 24. In (d) that shows the state of the post baking process, the water is completely evaporated, only the foreign material 30 from the photoresist film 12 remains. Although the foreign material 30 has different ingredients depending on kinds, the foreign material 30 which mainly includes fluorine and sulfur is not dissolved in the subsequent developing process and remains a defect.

FIGS. 5a through 5d are diagrams illustrating a T-top pattern forming mechanism by water drops in an immersion lithography process.

Figure 5A:
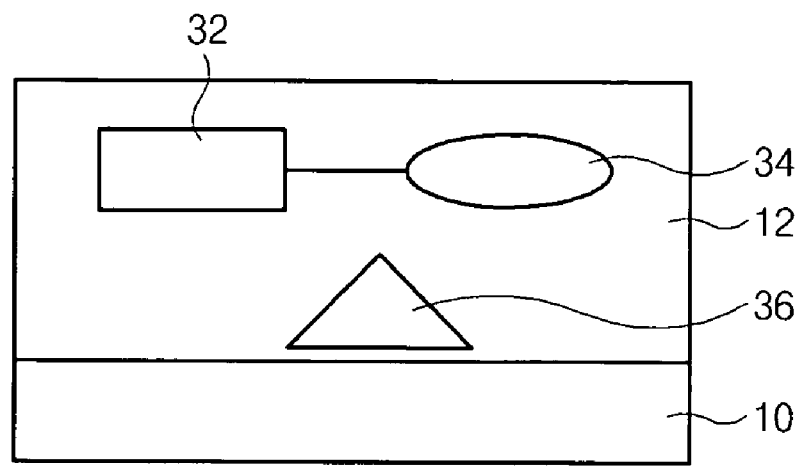
FIGS. 5a through 5d are diagrams illustrating a T-top pattern forming mechanism by water drops in an immersion lithography process.

FIG. 5a shows when the photoresist film 12 is coated over the underlying layer (not shown) of the semiconductor substrate 10 and then baked. The photoresist film 12 includes a photoacid generator 36 and a photoresist resin 32 having a dissolving inhibitor 34.

Figure 5B:
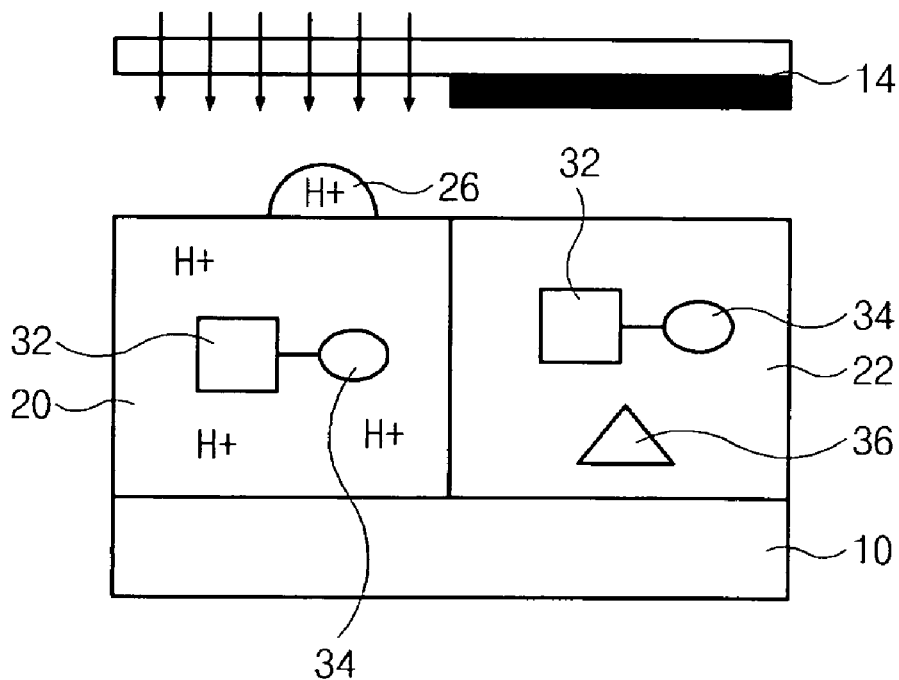

FIG. 5b shows the state after exposure with the exposer for immersion lithography. The water mark 26 is generated over the photoresist film 12, and $H^+$ generated from the photoacid generator 36 exists in the exposed region 20. The $H^+$ of the exposed region 20 is dissolved in the water mark 26 to be exhausted.

Figure 5C:
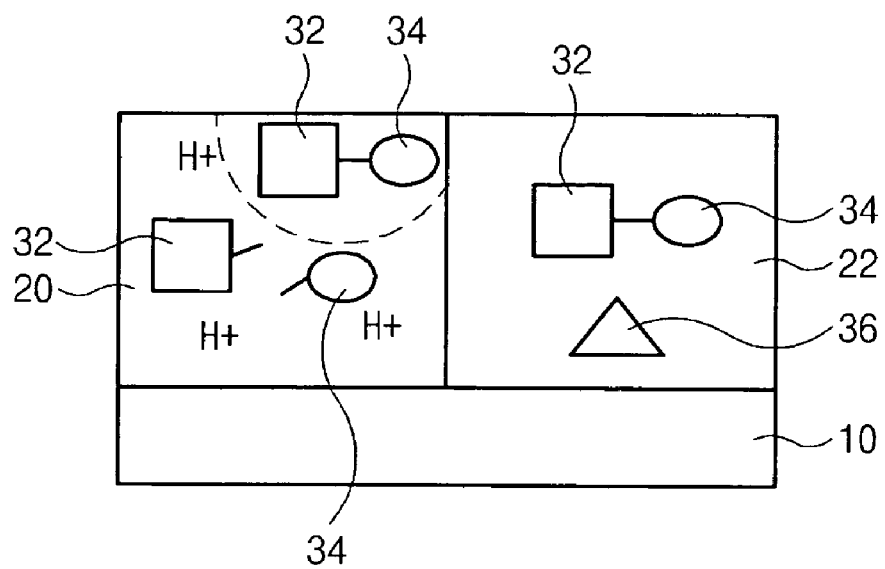

FIG. 5c shows the state after a post baking process. The $H^+$ serves as a catalyst to detach the dissolving inhibitor 34 from the photoresist resin 32. However, the detachment reaction does not occur because the $H^+$ does not exist in the exposed region 20.

Figure 5D:
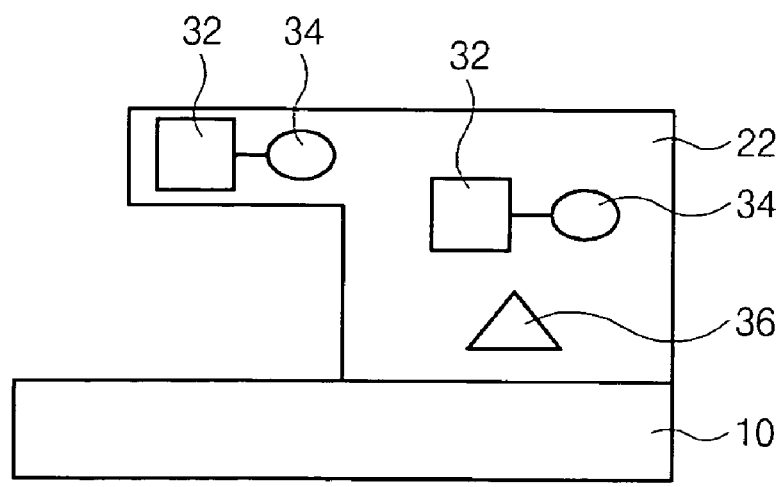

FIG. 5d shows that a T-top shaped pattern is formed. Since the $H^+$ does not exist in the portion having the water mask 26 so that the detachment reaction does not occur, the pattern is not dissolved in the developing solution to have a T-top shape. Meanwhile, the pattern is not dissolved in a developing solution such as a TMAH aqueous solution because the dissolving inhibitor 34 is not detached from the photoresist resin 32 in the inexposed region 22 of the photoresist film 12.

FIGS. 6a through 6f are diagrams illustrating a method for manufacturing a semiconductor device using an immersion lithography process according to a specific embodiment of the present invention.

ArF photoresist (TARF-P6111 produced by TOK Co.) is coated at a thickness ranging from about 0.1 to about 0.2 μm over an underlying layer (not shown) of a semiconductor substrate 110. The resulting structure is soft-baked at about 130° C. for about 90 seconds to form a photoresist film 112. As the ArF photoresist, any of immersion resists can be used such as TCX-015 of JSR Co. and IOC-73 of Shinetsu Co. except TARF-P6111 of TOK Co. (Refer to FIG. 6a).

The photoresist film 112 is exposed without using an exposure mask, with an exposure energy ranging from about 1 to about 5 $mJ/cm^2$ during such time that the acid contained in the upper portion of the photoresist film 112 is released. The thickness of the upper portion of the photoresist film 112 ranges about 2 to about 3% of that of the photoresist film 112. As a result of the exposure process without using the exposure mask, an exposure layer 140 ranging from about 0.002 to about 0.006 μm is formed, which is used as a sacrificial film for removing a water mark. Although the final thickness of the resist pattern is reduced, this reduction poses no problem because the photoresist film 112 has the thick initial thickness ranging from about 0.1 to about 0.2 μm (Refer to FIG. 6b).

Deionized water is sprayed from a water sprayer 150 to wash the photoresist film 112, which is a pre-soak process to remove ingredients such as a photoacid generator and a quencher which exist in the exposure layer 140 before a exposure process using an exposure mask.

The pre-soak process reduces contamination of an exposure lens to improve exposure uniformity as well as pattern line-width uniformity. When the contamination of the exposure lens is reduced, the washing period of the lens is shortened so that the lens durability becomes longer as well as the exposer durability (Refer to FIG. 6c).

The exposure process is performed using the exposure mask 114 and an exposer for immersion lithography. The light source of the exposure process is selected from the group consisting of G-line (436 nm), i-line (365 nm), KrF (248 nm), ArF (193 nm), $F_2$ (157 nm) and EUV (13 nm).

$H_2O$ 118 is used as a medium of exposure beams between substrates 110 including the photoresist film 112 and the exposure lens 116 of the exposer. As a result of the exposure process, an exposed region 120 and an unexposed region 122 are formed in the photoresist film 112 and the exposure layer 140, and water drops 124 are formed over the exposure layer 140.

Figure 6A:
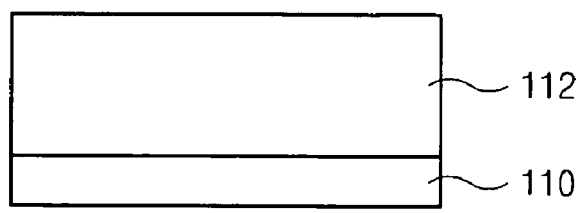
FIGS. 6a through 6f are diagrams illustrating a method for manufacturing a semiconductor device using an immersion lithography process according to a specific embodiment of the present invention.
Figure 6B:
Figure 6B:
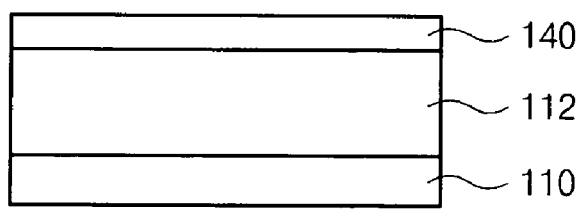
Figure 6C:
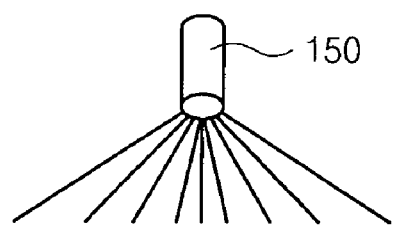
Figure 6C:
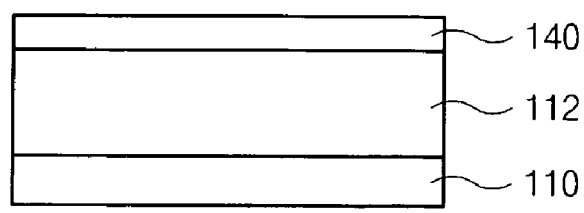
Figure 6D:
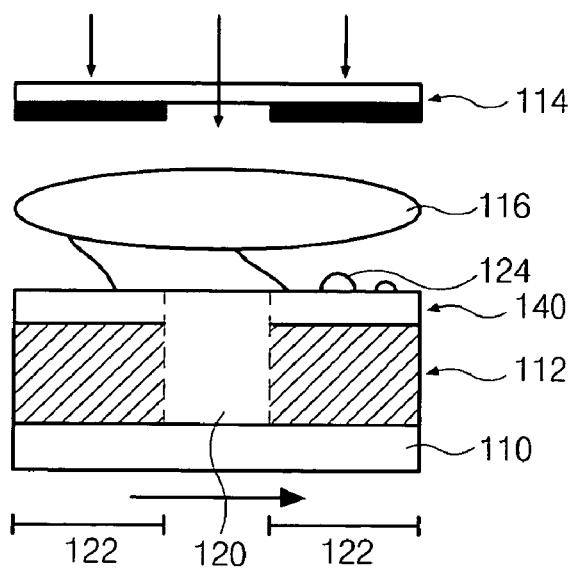
Figure 6E:
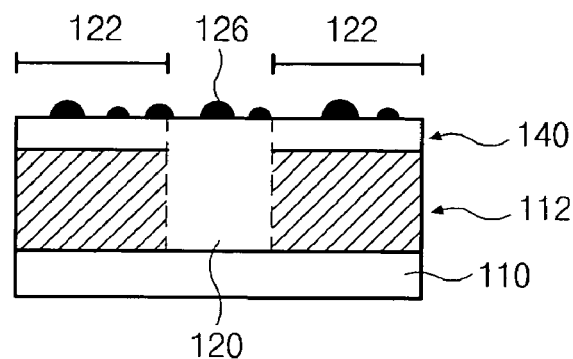
Figure 6F:
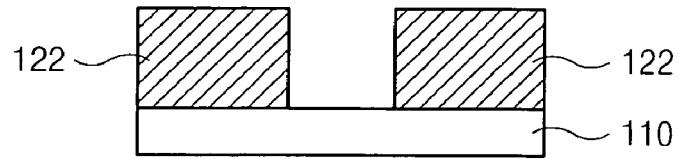

FIG. 6d shows that an exposure stage (not shown) is scanned and moved rightward. While the stopped stage is scanned, the water drop 124 is generated. When the stage is moved rightward, a meniscus of the $H_2O$ 118 bends leftward and breaks to form water drops 124 which drops down to the exposure layer 140 (Refer to FIG. 6d).

The water drop 124 is evaporated for a delay time before baking, which remains a water mark 126.

The resulting structure is baked at about 130° C. for about 90 seconds. Although the water mark 126 consumes an acid over the exposure layer 140, the residual acid remains in the exposure layer 140. As a result, a detachment reaction occurs in the exposure layer 140 during the baking process (Refer to FIG. 6e).

When the resulting structure is developed with 2.38 wt % TMAH aqueous solution for about 20 seconds, the photoresist film 112 and the exposure layer 140 of the exposed region 120 and the exposure layer 140 of the unexposed region 122 are dissolved in the developing solution. As a result, the photoresist film 112 of the unexposed region 122 remains a pattern to form a photoresist pattern (Refer to FIG. 6f).

As described above, according to an embodiment of the present invention, a photoresist film is formed over an underlying layer of a semiconductor substrate, and an exposure layer having a sufficient acid is pre-formed over the photoresist film. After exposure using immersion lithography, a water mark generated from the exposure layer consumes a part of the acid of the exposure layer but the residual acid remains in the exposure layer to prevent generation of pattern defects such as T-top or pattern bridges, thereby improving semiconductor product yield. Moreover, a pre-soak process is performed before the exposure process using immersion lithography to reduce contamination of exposure lens, thereby improving exposure uniformity as well as pattern line-width uniformity. When the contamination of the exposure lens is reduced, the washing period of the lens is shortened to extend durability of the lens and the exposer.

The above embodiments of the present invention are illustrative and not limitative. Various alternatives and equivalents are possible. Other additions, subtractions, or modifications are obvious in view of the present disclosure and are intended to fall within the scope of the appended claims.

What is claimed is:

1. A method for manufacturing a semiconductor device using an immersion lithography process, the method comprising:
    forming a photoresist film over an underlying layer of a semiconductor substrate;
    performing a first exposure process on the photoresist film without using an exposure mask to form a sacrificial film having 2% to 3% thickness of the whole thickness of the photoresist film within the upper portion of the whole photoresist film;
    performing a second exposure process on the photoresist film by immersion lithography, wherein the second exposure process is performed after the first exposure process is performed;
    baking the photoresist film after the performance of the first and second exposure processes; and
    developing the exposed photoresist film and the sacrificial film to form a photoresist pattern.

2. The method according to claim 1, wherein forming a photoresist film over an underlying layer of a semiconductor substrate includes softly baking the semiconductor substrate coated with a photoresist at 130° C. for 90 seconds.

3. The method according to claim 1, wherein the photoresist film is coated at a thickness ranging from 0.1 to 0.2 μm over the underlying layer of the semiconductor substrate.

4. The method according to claim 1, wherein the first exposure process is performed with an exposure energy ranging from approximately 1 to approximately 5 mJ/cm$^2$.

5. The method according to claim 1, further comprising performing a pre-soak process on the photoresist film with deionized water before the second process is performed.

6. The method according to claim 1, wherein the first exposure process and the second exposure process are performed using an exposure light selected from the group consisting of G-line (436 nm), i-line (365 nm), KrF (248 nm), ArF (193 nm), F$_2$ (157 nm) and EUV (13 nm).

7. The method according to claim 1, wherein the second exposure process is performed with H$_2$O as a medium of exposure between the semiconductor substrate including the photoresist film and an exposure lens of an exposer.

8. The method according to claim 1, wherein the developing process is performed with 2.38 wt % TMAH aqueous solution for 20 seconds.

* * * * *